(12) United States Patent
Kobayashi et al.

(10) Patent No.: US 9,504,151 B2
(45) Date of Patent: Nov. 22, 2016

(54) CONDUCTIVE COMPOSITION AND CONDUCTIVE FILM

(71) Applicant: TOKAI RUBBER INDUSTRIES, LTD., Aichi-ken (JP)

(72) Inventors: Jun Kobayashi, Aichi-ken (JP); Yusuke Yamashita, Aichi-ken (JP); Yutaro Taguchi, Aichi-ken (JP); Hitoshi Yoshikawa, Aichi-ken (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 113 days.

(21) Appl. No.: 14/225,910

(22) Filed: Mar. 26, 2014

(65) Prior Publication Data

US 2014/0202744 A1 Jul. 24, 2014

Related U.S. Application Data

(63) Continuation of application No. PCT/JP2013/056962, filed on Mar. 13, 2013.

(30) Foreign Application Priority Data

Mar. 29, 2012 (JP) ................................ 2012-077419

(51) Int. Cl.
 *H01B 1/24* (2006.01)
 *H05K 1/02* (2006.01)
 (Continued)

(52) U.S. Cl.
 CPC ............... *H05K 1/11* (2013.01); *C01B 31/04* (2013.01); *C08K 3/04* (2013.01); *C08L 101/12* (2013.01);
 (Continued)

(58) Field of Classification Search
 USPC ............................................ 174/254; 428/323
 See application file for complete search history.

(56) References Cited

U.S. PATENT DOCUMENTS 6,819,034 B1 * 11/2004 Pavlovsky ............... H01J 1/304
 313/311
7,449,133 B2 * 11/2008 Gruner ................... B82Y 30/00
 252/500

(Continued)

FOREIGN PATENT DOCUMENTS

CN 1922256 2/2007
EP 1 981 035 10/2008

(Continued)

OTHER PUBLICATIONS

English Translation of International Preliminary Report on Patentability of International Application No. PCT/JP2013/056962, which was issued Oct. 1, 2014.

(Continued)

*Primary Examiner* — Michael F McAllister
(74) *Attorney, Agent, or Firm* — Greenblum & Bernstein, P.L.C.

(57) ABSTRACT

Provided is a conductive film having a high conductivity in which electric resistance is less likely to increase, and a conductive composition for forming the same. The conductive composition includes an elastomer component, a fibrous carbon material having a fiber diameter of less than 30 nm, and a flake-like carbon material having a graphite structure, having an intensity ratio (G/D ratio) of a peak (G band) appearing in the vicinity of 1580 cm$^{-1}$ to a peak (D band) appearing in the vicinity of 1330 cm$^{-1}$ of Raman spectrum of not less than 1.8, and having a maximum length of not less than 150 nm and a thickness of not more than 100 nm. The conductive film is formed from the conductive composition.

10 Claims, 4 Drawing Sheets

(51) Int. Cl.
*H05K 1/11* (2006.01)
*C01B 31/04* (2006.01)
*C08K 3/04* (2006.01)
*C08L 101/12* (2006.01)
*H05K 1/09* (2006.01)

(52) U.S. Cl.
CPC ............. *H01B 1/24* (2013.01); *H05K 1/028* (2013.01); *H05K 1/095* (2013.01); *H05K 1/0283* (2013.01); *H05K 2201/026* (2013.01); *H05K 2201/0245* (2013.01); *H05K 2201/0281* (2013.01); *H05K 2201/0314* (2013.01); *H05K 2201/0323* (2013.01); *Y10T 428/254* (2015.01)

(56) References Cited

U.S. PATENT DOCUMENTS

| | | | |
|---|---|---|---|
| 8,446,075 B2 | 5/2013 | Takahashi et al. | |
| 8,709,373 B2 * | 4/2014 | Hauge | B82Y 30/00 423/447.1 |
| 2003/0042467 A1 * | 3/2003 | Rossini | C09D 5/033 252/500 |
| 2005/0045856 A1 * | 3/2005 | Yoshikawa | H01L 51/0037 252/500 |
| 2006/0113878 A1 * | 6/2006 | Pei | F02G 1/043 310/363 |
| 2006/0216516 A1 | 9/2006 | Handa et al. | |
| 2007/0259994 A1 * | 11/2007 | Tour | B82Y 30/00 523/333 |
| 2009/0001326 A1 * | 1/2009 | Sato | B82Y 30/00 252/511 |
| 2009/0022649 A1 * | 1/2009 | Zhamu | B82Y 30/00 423/415.1 |
| 2009/0124746 A1 * | 5/2009 | Handa | C08K 7/06 524/496 |
| 2009/0142581 A1 * | 6/2009 | Heintz | B82Y 30/00 428/323 |
| 2009/0292057 A1 * | 11/2009 | Handa | C08J 5/042 524/495 |
| 2010/0028613 A1 * | 2/2010 | Schmidt | B82Y 30/00 428/172 |
| 2010/0096597 A1 * | 4/2010 | Prud'Homme | B82Y 30/00 252/511 |
| 2010/0254886 A1 * | 10/2010 | McElrath | B82Y 10/00 423/447.2 |
| 2010/0301278 A1 * | 12/2010 | Hirai | B82Y 30/00 252/502 |
| 2011/0152435 A1 * | 6/2011 | Morishita | B82Y 30/00 524/504 |
| 2011/0260116 A1 | 10/2011 | Plee et al. | |
| 2012/0146464 A1 | 6/2012 | Kobayashi et al. | |
| 2014/0090884 A1 | 4/2014 | Kobayashi et al. | |

FOREIGN PATENT DOCUMENTS

| | | | | |
|---|---|---|---|---|
| JP | 02-058552 | * | 2/1990 | |
| JP | 2000-027072 | | 1/2000 | |
| JP | 2001-151833 | | 6/2001 | |
| JP | 2003-156902 | | 5/2003 | |
| JP | 2007-016122 | | 1/2007 | |
| JP | 2007-273283 | | 10/2007 | |
| JP | 2008-198425 | | 8/2008 | |
| JP | 2009-079185 | | 4/2009 | |
| JP | 2009-227985 | | 10/2009 | |
| JP | 2011-522920 | | 8/2011 | |
| WO | WO2004/096704 A | * | 11/2004 | ............ C01B 31/00 |
| WO | WO 2004/096704 A | * | 11/2004 | ............ C01B 31/00 |
| WO | 2009/147415 | | 12/2009 | |
| WO | 2011/077598 | | 6/2011 | |
| WO | 2011/118315 | | 9/2011 | |

OTHER PUBLICATIONS

U.S. Appl. No. 14/226,130 to Jun Kobayashi et al., which was filed on Mar. 26, 2014.
International Search Report for PCT/JP2013/056962, which was mailed on May 21, 2013.
Extended European Search Report for Application No. 13769474.1, which was mailed on Oct. 8, 2015.
Korean Office Action dated Sep. 9, 2015; along with a partial English translation thereof.
English translation of paragraph of Japanese Patent Application Publication No. 2009-227985 (Oct. 8, 2009), which was cited in Korean Office Action corresponding to Cite No. 2.
Office Action issued in China Patent Appl. No. 2013800040229, dated Mar. 4, 2016, along with an English translation thereof.

* cited by examiner

CONDUCTIVE COMPOSITION AND CONDUCTIVE FILM

CLAIM FOR PRIORITY

This application is a Continuation of PCT/JP2013/056962 filed Mar. 13, 2013, and claims the priority benefit of Japanese application 2012-077419, filed Mar. 29, 2012, the contents of which is expressly incorporated by reference herein in its entirety.

TECHNICAL FIELD

The present invention relates to a conductive film suitable for, for example, electrodes and wires for flexible transducers including a polymer material, electromagnetic shields, and flexible wiring boards, and a conductive composition for forming the same.

BACKGROUND ART

Transducers are known, such as actuators and sensors that perform conversion between mechanical energy and electric energy, or speakers and microphones that perform conversion between acoustic energy and electric energy. To form highly flexible, compact, and lightweight transducers, polymer materials such as dielectric elastomers are useful. For example, an actuator can be formed with a pair of electrodes arranged on both front and back surfaces of a dielectric layer of a dielectric elastomer. A capacitance-type sensor can also be formed with electrodes with a dielectric layer interposed therebetween.

In the actuators and sensors of this type, it is desirable that the electrodes are expandable and contractible in accordance with deformation of the dielectric layer. To form flexible electrodes, conductive materials have been developed that are formed by blending conductive carbon black or metal powder in a binder such as an elastomer. For example, Patent Document 1 discloses an electrode obtained by blending particular carbon nanotubes having a three dimensional shape and carbon black in an elastomer. Patent Document 2 discloses an electrode obtained by blending carbon nanotubes in a base rubber.

RELATED ART DOCUMENTS

Patent Documents

Patent Document 1: Japanese Patent Application Publication No. 2008-198425 (JP 2008-198425 A)
Patent Document 2: Japanese Patent Application Publication No. 2009-227985 (JP 2009-227985 A)
Patent Document 3: Japanese Patent Application Publication No. 2001-151833 (JP 2001-151833 A)

SUMMARY OF THE INVENTION

Problem to be Solved by the Invention

The conductivity of conventional electrodes, however, is not considered to be sufficient. In particular, an increase in electric resistance is large during expansion. In general, carbon materials having a graphite structure are suitable as a conductive material because of their high crystallinity and excellent conductivity. Graphite powder and graphitized carbon nanotubes are relatively inexpensive and readily available, but most of them have a large particle diameter or tube diameter. Thus, even when such a material is blended in an elastomer to form a flexible electrode, it is impossible to form a minute conductive path. Moreover, cracks easily occur during expansion, and the electric resistance significantly increases. When a fibrous carbon material having a fiber diameter (diameter) of less than 30 nm is used as a minute conductive material, the fibrous carbon material is less likely to come into mutual contact, and the area of the contact point is small. For this reason, during expansion, the conduction achieved by the mutual contact of the fibrous carbon material is broken, and the electric resistance increases. When commercially available multi-walled carbon nanotubes are used, the carbon nanotubes are in contact with each other, but the conductivity of the carbon nanotubes themselves is low, thereby increasing the electric resistance.

The present invention was made in view of the aforementioned situation and aims to provide a conductive film that has a high conductivity and in which electric resistance is less likely to increase, and a conductive composition for forming the same.

Means for Solving the Problem (1) To solve the aforementioned problem, a conductive composition according to the present invention is characterized by including an elastomer component, a fibrous carbon material having a fiber diameter of less than 30 nm, and a flake-like carbon material having a graphite structure, having an intensity ratio (G/D ratio) of a peak (G band) appearing in the vicinity of 1580 $cm^{-1}$ to a peak (D band) appearing in the vicinity of 1330 $cm^{-1}$ of Raman spectrum of not less than 1.8, and having a maximum length of not less than 150 nm and a thickness of not more than 100 nm.

When a small-diameter fibrous carbon material is blended as a conductive material in an elastomer as described above, there are few mutual contact points of the conductive material, or the conductivity of the conductive material itself is low. Thus, the electric resistance is high, and it is difficult to ensure conductivity during expansion. In this respect, in the conductive composition according to the present invention, the flake-like carbon material having a particular size is blended in addition to the small-diameter fibrous carbon material. The flake-like carbon material has a graphite structure and has a G/D ratio of not less than 1.8. That is, the crystallinity is high, and the conductivity is good. Therefore, the conductivity of the conductive film can be improved by dispersing the flake-like carbon material in an elastomer. The maximum length of the flake-like carbon material is not less than 150 nm, and the thickness thereof is not more than 100 nm. As shown in FIG. 2 later, the flake-like carbon material serves the function of coupling the dispersed pieces of the fibrous carbon material with each other. The flake-like carbon material is arranged so as to cover the mutual contact points of the fibrous carbon material, thereby increasing the contact area and making it easier to keep the conduction even during expansion. As a result, an increase in electric resistance during expansion can be prevented in the conductive film. The effects of the present invention will be explained using a schematic diagram.

FIG. 1 schematically shows changes in volume resistivity of conductive materials with respect to elongation. As shown in FIG. 1, when graphite powder alone is blended in the elastomer, the volume resistivity in a natural state (before expansion) is small, but the volume resistivity sharply increases with the expansion. When a small-diameter fibrous carbon material alone is blended in the elastomer, the change in volume resistivity due to expansion is smaller compared to the case where graphite powder is blended, but the volume resistivity in a natural state is large. By contrast, with the conductive film formed from the conductive composition according to the present invention, the conductivity in a natural state is improved, and the increase in electric resistance during expansion is reduced, because of the conductivity of the flake-like carbon material itself and the effect of mutual bridging of the fibrous carbon material.

(2) A conductive film according to the present invention is formed from the conductive composition of the present invention. Specifically, the conductive film of the present invention includes a fibrous carbon material having a fiber diameter of less than 30 nm, and a flake-like carbon material having a graphite structure, having an intensity ratio (G/D ratio) of a peak (G band) appearing in the vicinity of 1580 $cm^{-1}$ to a peak (D band) appearing in the vicinity of 1330 $cm^{-1}$ of Raman spectrum of not less than 1.8, and having a maximum length of not less than 150 nm and a thickness of not more than 100 nm. As described above, in the conductive film of the present invention, the flake-like carbon material is arranged so as to cover the mutual contact points of the fibrous carbon material. Thus, the fibrous carbon material is likely to come into mutual contact, and the contact area increases. This achieves a conductive film that has a high conductivity and in which the electric resistance is less likely to increase even during expansion because of the conductivity of the flake-like carbon material itself and the effect of mutual bridging of the fibrous carbon material.

(3) An electromagnetic shield according to the present invention is formed of the conductive film of the present invention having the constitution described in (2) above.

The electromagnetic shield of the present invention is flexible and has a high conductivity, and the electric resistance is less likely to increase even during expansion. Even for the use in an expandable/contractible member, the shield performance is less likely to be reduced. The electromagnetic shield of the present invention therefore has good durability.

(4) A transducer according to the present invention includes a dielectric layer made of a polymer, a plurality of electrodes arranged with the dielectric layer interposed therebetween, and a wire connected to each of the electrodes. Either or both of the electrodes and the wire are formed of the conductive film of the present invention having the constitution described in (2) above.

A transducer is a device that converts one form of energy into another form of energy. Transducers include actuators, sensors, power generation elements, and the like for performing conversion between mechanical energy and electrical energy, and speakers, microphones, and the like for performing conversion between acoustic energy and electrical energy. The electrodes and wires formed of the conductive film of the present invention are flexible and have a high conductivity, and the electric resistance is less likely to increase even during expansion. In the transducer of the present invention, therefore, the motion of the dielectric layer is less likely to be restricted by the electrodes and the wires. The electric resistance is less likely to increase over repeated expansion and contraction. In the transducer of the present invention, therefore, degradation in performance due to the electrodes and the wires is less likely to occur. The transducer of the present invention therefore has good durability.

(5) A flexible wiring board according to the present invention includes a substrate and a wire arranged on a surface of the substrate. At least part of the wire is formed of the conductive film of the present invention having the constitution described in (2) above.

The wire formed of the conductive film of the present invention is flexible and has a high conductivity, and the electric resistance is less likely to increase even during expansion. Thus, the performance of the flexible wiring board of the present invention is less likely to be degraded even when the substrate expands and contracts. The flexible wiring board of the present invention therefore has good durability.

DESCRIPTION OF THE REFERENCE NUMERALS

Figure 1:
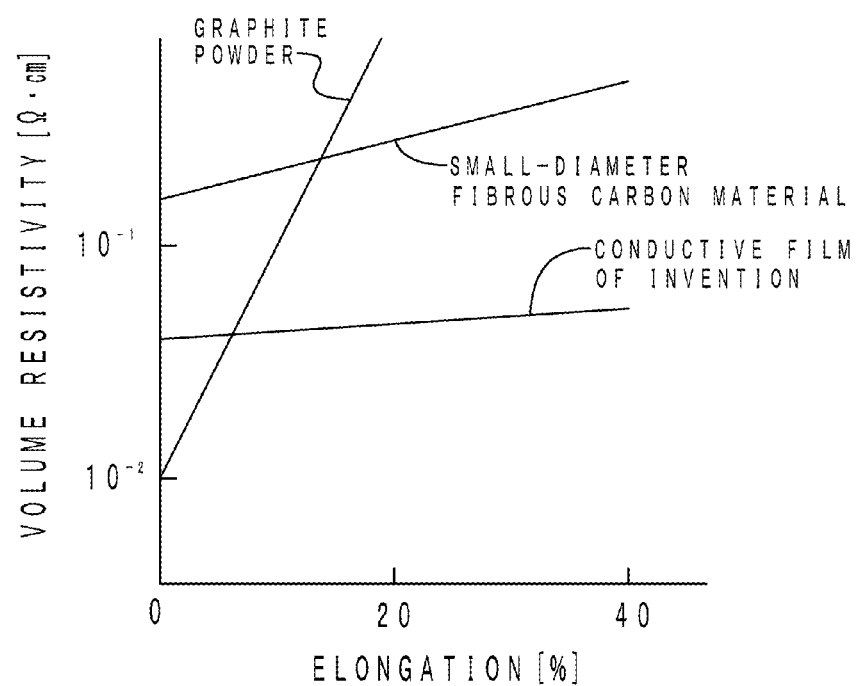
FIG. 1 is a schematic diagram showing changes in volume resistivity of conductive materials with respect to elongation.

1: actuator (transducer), 10: dielectric layer, 11a, 11b: electrode, 12a, 12b: wire, 13: power source.

5: flexible wiring board, 50: substrate, 51: front wire connector, 52: back wire connector, 01X to 16X: front electrode, 01Y to 16Y: back electrode, 01x to 16x: front wire, 01y to 16y: back wire.

MODES FOR CARRYING OUT THE INVENTION

<Conductive Composition>

The conductive composition of the present invention includes an elastomer component, a fibrous carbon material having a fiber diameter of less than 30 nm, having a flake-like carbon material having a graphite structure and an intensity ratio (G/D ratio) of the peak (G band) appearing in the vicinity of 1580 $cm^{-1}$ to the peak (D band) appearing in the vicinity of 1330 $cm^{-1}$ of Raman spectrum of not less than 1.8, and having a maximum length of not less than 150 nm and a thickness of not more than 100 nm. In this description, the elastomer includes cross-linked rubbers and thermoplastic elastomers. Examples of the elastomer component included in the conductive composition of the present invention therefore include rubber polymers before cross-linkage and thermoplastic elastomers.

The elastomer preferably has a glass transition temperature (Tg) being room temperatures or lower, in view of having rubber-like elasticity at room temperatures. When Tg is lower, the crystallinity decreases. The elastomer becomes more expandable and contractible accordingly. For example, an elastomer having Tg of not more than −20° C., more preferably not more than −35° C., is more flexible and thus, suitable. As the elastomer, one kind thereof may be used singly, or a mixture of two or more kinds thereof may be used.

The elastomer is preferably a cross-linked rubber because the restorability is good when deformation is repeated. Another preferred example is a material, such as a thermoplastic elastomer, that has a microphase separation structure of a hard segment and a soft segment and forms a pseudo cross-link. Examples of a material having a cross-linkable functional group include urethane rubber, acrylic rubber, silicone rubber, butyl rubber, butadiene rubber, ethylene oxide-epichlorohydrin copolymer, nitrile rubber, chloroprene rubber, natural rubber, isoprene rubber, styrene-butadiene rubber, ethylene-propylene-diene copolymer (EPDM), silicone rubber, and polyester rubber. Among those, acrylic rubber has a low crystallinity and a weak intermolecular force and thus has a Tg lower than those of the other rubbers. Thus, it is flexible and well expandable, and is suitable for electrodes of actuators, sensors, and the like.

The fibrous carbon material may be either hollow or solid. Examples thereof include carbon nanotubes and carbon fibers. Among those, a material having a fiber diameter (diameter) of less than 30 nm can be used. As the fibrous carbon material, one kind thereof may be used singly, or a mixture of two or more kinds thereof may be used. To achieve the desired conductivity, the content of the fibrous carbon material is preferably not less than 5% by mass with respect to 100% by mass of the solid content of the conductive composition. Meanwhile, in consideration of the flexibility, the content of the fibrous carbon material is preferably not more than 30% by mass with respect to 100% by mass of the solid content of the conductive composition.

The flake-like carbon material has a maximum length of not less than 150 nm and a thickness of not more than 100 nm. The flake-like carbon material can be produced from, for example, a carbon material having a graphite structure, a G/D ratio of the Raman spectrum of not less than 1.8, and a ratio of the minimum length to the maximum length (minimum length/maximum length) of not more than ⅕. For example, the flake-like carbon material can be produced by milling the carbon material. Examples of the carbon material as a raw material include carbon nanotubes, cup-stacked carbon nanotubes, graphite, and expanded graphite. For example, carbon nanotubes having a fiber diameter of 30 nm or more are preferred because they are inexpensive and readily available. Cup-stacked carbon nanotubes have a structure in which cup-shaped carbon networks open at the bottom are stacked. When cup-stacked carbon nanotubes are milled, the carbon network cups are pulled out. The length of cup-stacked carbon nanotubes can thus be adjusted easily. By the milling process, cup-stacked carbon nanotubes can be formed into a shape that is optimum for mutual coupling of the conductive material. In addition, graphite is preferred because it has a high crystallinity, a high conductivity, and is inexpensive and readily available. Expanded graphite has scale-like graphite layers between which a substance that produces gas by heating is sandwiched. Expanded graphite is therefore easily separated between the layers during milling to produce a flake-like carbon material easily.

The milling process for the carbon material may be either a dry process or a wet process. In the case of a dry process, a ball mill, a Henschel mixer, or the like may be used to perform milling with high-speed rotation and collisional mixing. When the conductive composition is prepared in a liquid state, a wet process is preferred, that is, the milling process is performed in liquid. Milling in liquid provides a shear force on the carbon material easily. As a result, a flake-like carbon material on the order of nanometers is easily obtained. An organic solvent may be used as the liquid in which the carbon material is dispersed in the milling process. The addition of a dispersant to the organic solvent can suppress aggregation of the milled carbon material. If a polymer solution containing the elastomer component dissolved in the organic solvent is used, the liquid after the milling process can be used as it is for preparation of a liquid conductive composition (conductive coating). In the milling process, milling media of ceramics, glass, or other materials are desirably used. The milling may be performed with application of ultrasound. The application of ultrasound can suppress aggregation of the milled carbon material.

The carbon material after the milling process may contain particles other than the flake-like carbon material, such as particles having a thickness exceeding 100 nm. In this case, the number proportion of the flake-like carbon material in all the particles after the milling process is preferably not less than 5%. The number proportion of the flake-like carbon material can be obtained as follows, for example. First, the particle size distributions of the carbon material before and after the milling process are each measured with laser diffraction or other type of particle size distribution analyzer. The particle size distributions before and after the milling process are then compared with each other to calculate the number proportion of particles having a smaller particle diameter, which are generated through the milling process. The carbon material after the milling process is then observed with a transmission electron microscope (TEM) or a scanning electron microscope (SEM), and the number proportion of particles having a maximum length of not less than 150 nm and a thickness of not more than 100 nm is calculated.

To achieve mutual coupling of the fibrous carbon material and the effect of restraining an increase in electric resistance during expansion, the content of the flake-like carbon material is desirably not less than 3% by mass with respect to 100% by mass of the solid content of the conductive composition. Meanwhile, in consideration of the flexibility of the conductive composition, the content of the fibrous carbon material is desirably not more than 30% by mass with respect to 100% by mass of the solid content of the conductive composition.

To fully achieve the effect of mutual bridging of the fibrous carbon material by the flake-like carbon material itself, the blend ratio of the fibrous carbon material to the flake-like carbon material is desirably set in a range of 5:1 to 1:4 by mass.

The conductive composition of the present invention may contain an organic solvent and an additive such as a cross-linking agent, a cross-linking accelerator, a cross-linking aid, a plasticizer, a processing aid, an antioxidant, a softener, and a colorant. The cross-linking agent, cross-linking accelerator, cross-linking aid, and the like may be selected as appropriate depending on, for example, the kind of the elastomer.

The addition of a plasticizer and a softener can improve workability of the elastomer and further improve flexibility. Any plasticizer that has good compatibility with the elastomer can be used. Examples of the plasticizer that can be used include organic acid derivatives such as known phthalate diesters, phosphoric acid derivatives such as tricresyl phosphate, adipic acid diesters, chlorinated paraffins, and polyether esters. Plant-based softeners and mineral softeners can be used as the softener. Examples of the plant-based softeners include stearic acid, lauric acid, ricinoleic acid, palmitic acid, cottonseed oil, soybean oil, castor oil, palm oil, pine tar oil, tall oil, and factice. Examples of the mineral softeners include paraffin-based, naphthene-based, and aroma-based oils.

The conductive composition of the present invention can be prepared, for example, by kneading a mixture of the elastomer component, the fibrous carbon material, the flake-like carbon material, and an additive blended if necessary, with a pressure kneading machine such as a kneader or a Banbury mixer, a twin roll, or the like. Alternatively, the conductive composition can be prepared by adding the fibrous carbon material, the flake-like carbon material, and an additive blended if necessary, to a polymer solution containing the elastomer component dissolved in an organic solvent, and mixing them with a wet dispersion machine or the like (conductive coating). When a polymer solution is used as a liquid for the milling process in production of the flake-like carbon material, the conductive composition (conductive coating) may be prepared by adding the fibrous carbon material and an additive, blended if necessary, to the polymer solution containing the flake-like carbon material after the milling process and mixing them. When the conductive composition is liquid, a conductive film can be formed easily by applying the conductive coating on a substrate.

Examples of the method of applying the conductive coating include printing processes such as screen printing, inkjet printing, flexographic printing, gravure printing, pad printing, metal mask printing, and lithography, and further include a dipping process, a spray process, and a bar coating process. For example, the printing processes can easily form a thin film or a large-area conductive film. Also, with the printing processes, separation between a section to be coated and a section not to be coated is easy. Thus, even a conductive film in the form of a thin line or a complicated shape can be formed easily.

Among the printing processes, screen printing or metal mask printing are preferred. With screen printing and metal mask printing, plate-making is inexpensive, and large-area conductive films in various shapes can be formed easily. For example, it is possible to form a conductive film having an area as large as $0.2$ $m^2$ or more per printing pattern. In addition, the film thickness can be easily controlled, and therefore a conductive film as thick as 50 μm or more can be formed easily, for example. A thick conductive film has a smaller electric resistance, thereby improving the performance of devices.

<Conductive Film>

The conductive film of the present invention is formed from the conductive composition of the present invention as described above. For example, the conductive film can be formed by applying the conductive composition (conductive coating) prepared in a coating state on a substrate and drying by heating. A variety of known methods can be employed as the method of application. In particular, screen printing is preferred as previously described.

The thickness of the conductive film of the present invention can be determined as appropriate depending on applications. For example, when the conductive film of the present invention is used as electrodes and/or wires of actuators, sensors, or the like, the thickness may be set to not less than 1 μm and not more than 500 μm.

The conductive film of the present invention is formed on a surface of various substrates including a dielectric layer. Examples of the substrates include bendable resin sheets of polyimide, polyethylene, polyethylene terephthalate (PET), polyethylene naphthalate (PEN) and other materials, and expandable and contractible elastomer sheets. Examples of the elastomer include acrylic rubber, EPDM, nitrile rubber, urethane rubber, butyl rubber, silicone rubber, chloroprene rubber, ethylene-vinyl acetate copolymer, and thermoplastic elastomers (olefinic, styrenic, polyester-based, acrylic, urethane-based, and polyvinyl chloride-based). When the conductive film of the present invention is formed on a surface of an expandable and contractible substrate, the flexibility is high, and the effect of being less likely to increase electric resistance during expansion is enhanced. For example, a substrate whose elongation at break measured in accordance with JIS K6251: 2010 is 5% or more is preferred.

If the adhesiveness of the conductive film on the substrate is insufficient, the conductive film may be separated from the substrate over repeated expansion and contraction. In addition, dielectric breakdown may be caused by, for example, voids generated between the conductive film and the substrate. The conductive film is therefore required to be bonded to the substrate reliably. For example, a polymer having a cross-linkable functional group is used as the elastomer component in the conductive composition for forming the conductive film, and a polymer having a functional group is used as the substrate. The functional group of the substrate is allowed to react during cross-linking of the elastomer component, so that the conductive film and the substrate can be bonded through chemical bonding. Thus, the adhesiveness of the conductive film with the substrate can be improved. For example, a functional group can be provided by performing surface treatment on the substrate. The surface treatment is performed by corona discharge, irradiation of plasma, laser, ultraviolet rays etc, primer coating, or other means.

<Electromagnetic Shield>

The electromagnetic shield according to the present invention is formed of the conductive film of the present invention. The electromagnetic shield serves the functions of blocking leakage of electromagnetic waves generated in electronic equipment to the outside and intrusion of external electromagnetic waves to the inside. For example, to provide the electromagnetic shield on the inner surface of the casing of electronic equipment, the conductive composition of the present invention prepared in a liquid state may be applied on the inner surface of the casing of electronic equipment and dried.

<Transducer>

The transducer of the present invention includes a dielectric layer made of a polymer, a plurality of electrodes arranged with the dielectric layer interposed therebetween, and a wire connected to each of the electrodes. The transducer of the present invention may have a stack structure in which the dielectric layer and the electrode are alternately stacked.

The dielectric layer is formed of a polymer, that is, a resin or an elastomer. Elastomers are preferred because they are expandable and contractible. In particular, an elastomer having a high dielectric constant is desirable in terms of increasing the amount of displacement and the force produced. Specifically, preferred is an elastomer having a dielectric constant (100 Hz) of 2 or more at room temperatures, more preferably 5 or more. Examples of the elastomer that may be used include elastomers having a polar functional group such as an ester group, a carboxyl group, a hydroxy group, a halogen group, an amide group, a sulfone group, a urethane group, and a nitrile group, or elastomers to which a polar low-molecular-weight compound having these polar functional groups. Examples of preferable elastomers include silicone rubber, acrylonitrile-butadiene rubber (NBR), hydrogenated acrylonitrile-butadiene rubber (H-NBR), EPDM, acrylic rubber, urethane rubber, epichlorohydrin rubber, chlorosulfonated polyethylene, and chlorinated polyethylene. The wording "made of a polymer" means that the base material of the dielectric layer is a resin or an elastomer. Thus, a component other than the elastomer or resin component, such as an additive, may be contained.

The thickness of the dielectric layer may be determined as appropriate depending on, for example, applications of the transducer. For example, in the case of an actuator, the thickness of the dielectric layer is desirably small in light of size reduction, low potential driving, larger displacement, and the like. In this case, also in consideration of a dielectric breakdown property and the like, the thickness of the dielectric layer is desirably not less than 1 μm and not more than 1000 μm (1 mm). The thickness of not less than 5 μm and not more than 200 μm is more preferred.

Either or both of the electrodes and the wire are formed of the conductive film of the present invention. The configuration and production process of the conductive film of the present invention are as described above. A description thereof is omitted here. Preferred modes of the conductive film of the present invention are also applied to the electrodes and wires of the transducer of the present invention. An embodiment of an actuator will be described below as an example of the transducer of the present invention.

Figure 3:
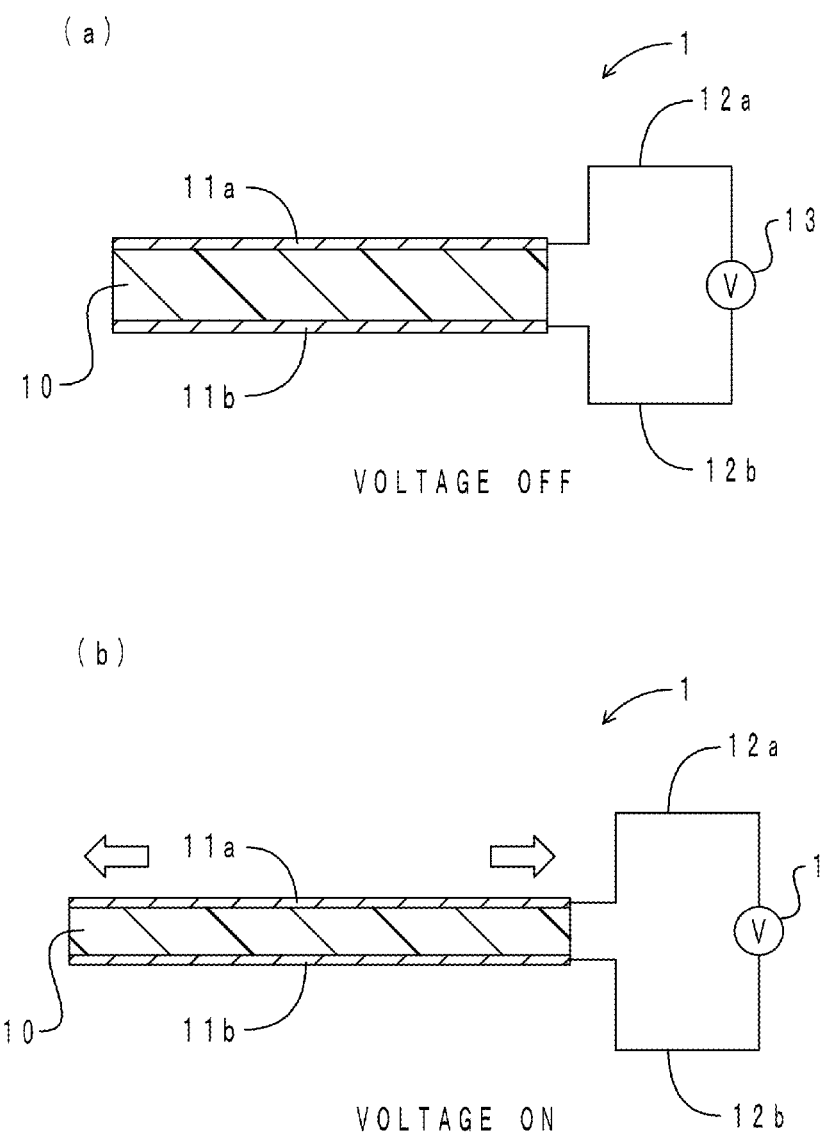
FIG. 3 is a schematic sectional view of an actuator as an embodiment of a transducer of the present invention, in which (a) shows a voltage-off state and (b) shows a voltage-on state.

FIG. 3 is a schematic sectional view of the actuator of the present embodiment. The voltage-off state is shown in (a), and the voltage-on state is shown in (b).

As shown in FIG. 3, the actuator 1 includes a dielectric layer 10, electrodes 11a, 11b, and wires 12a, 12b. The dielectric layer 10 is made of silicone rubber. The electrode 11a is arranged so as to cover almost the entire top surface of the dielectric layer 10. Similarly, the electrode 11b is arranged so as to cover almost the entire bottom surface of the dielectric layer 10. The electrodes 11a and 11b are connected to a power source 13 through the wires 12a and 12b, respectively. The electrodes 11a and 11b are formed of a conductive film formed by screen-printing the conductive composition of the present invention.

To switch the off state to the on state, voltage is applied between a pair of electrodes 11a and 11b. With the application of voltage, the thickness of the dielectric layer 10 decreases, and the dielectric layer 10 expands accordingly parallel to the plane of the electrodes 11a and 11b, as shown by white arrows in FIG. 3(b). The actuator 1 thereby outputs a drive force in the up/down direction and the left-right direction in the figure.

According to the present embodiment, the electrodes 11a and 11b are flexible and have expandability and contractibility. For this reason, the electrodes 11a and 11b are less likely to restrict the motion of the dielectric layer 10. A large force and amount of displacement therefore can be obtained with the actuator 1. The electrodes 11a and 11b have a high conductivity. In addition, the electric resistance is less likely to increase over repeated expansion and contraction. For this reason, degradation in performance due to the electrodes 11a and 11b is less likely to occur in the actuator 1. The actuator 1 therefore has good durability.

<Flexible Wiring Board>

The flexible wiring board of the present invention includes a substrate and a wire arranged on a surface of the substrate. The material of the substrate is not particularly limited. Examples thereof include bendable resin sheets and expandable and contractible elastomer sheets listed above as preferred examples of the substrate on which the conductive film of the present invention is formed.

At least part of the wire is formed of the conductive film of the present invention. The configuration and production process of the conductive film of the present invention are as described above. A description thereof is omitted here. Preferred modes of the conductive film of the present invention are also applied to the flexible wiring board of the present invention. An embodiment of the flexible wiring board of the present invention will be described below.

Figure 4:
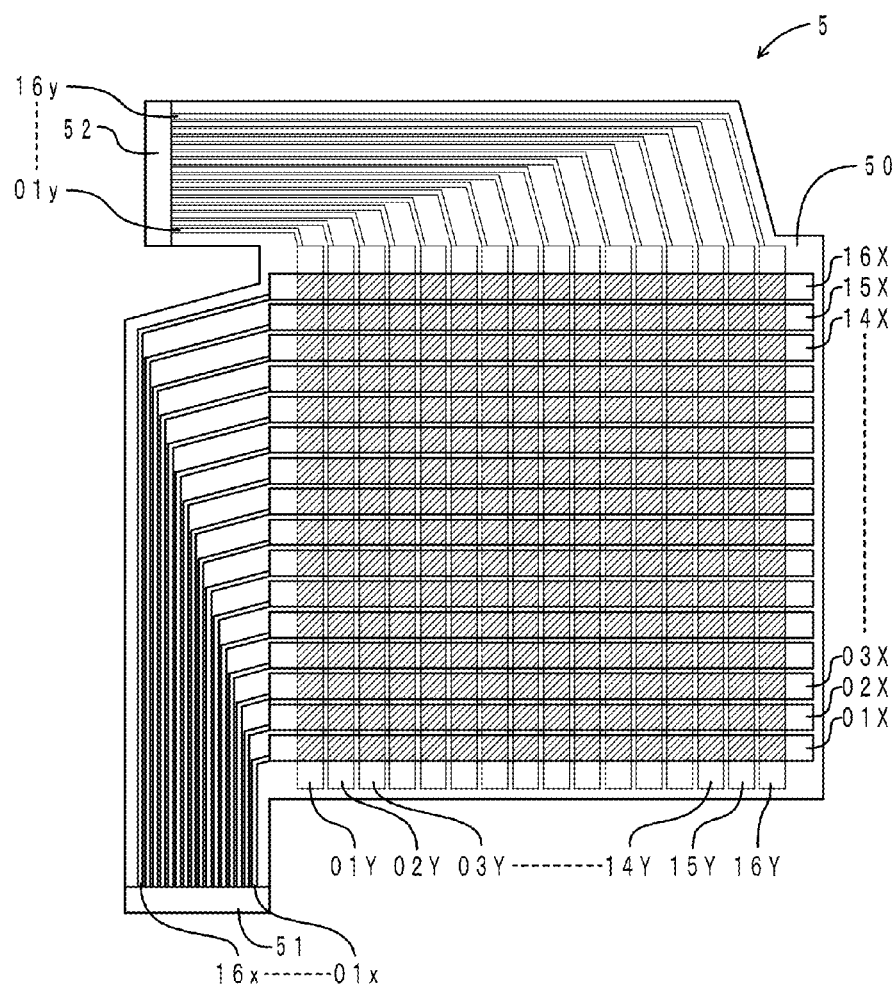
FIG. 4 is a top perspective view of a flexible wiring board of the present invention.

First, the configuration of the flexible wiring board of the present embodiment is described. FIG. 4 is a top perspective view of the flexible wiring board of the present embodiment. In FIG. 4, the electrodes and wires on the back side are shown by thin lines. As shown in FIG. 4, a flexible wiring board 5 includes a substrate 50, front electrodes 01X to 16X, back electrodes 01Y to 16Y, front wires 01x to 16x, back wires 01y to 16y, a front wire connector 51, and a back wire connector 52.

The substrate 50 is made of urethane rubber and shaped like a sheet. A total of 16 front electrodes 01X to 16X are arranged on the top surface of the substrate 50. The front electrodes 01X to 16X are each shaped like a strip. The front electrodes 01X to 16X each extend in the X direction (the left-right direction). The front electrodes 01X to 16X are arranged so as to be spaced apart at particular intervals in the Y direction (the front-rear direction) and approximately parallel to each other. Similarly, a total of 16 back electrodes 01Y to 16Y are arranged on the bottom surface of the substrate 50. The back electrodes 01Y to 16Y are each shaped like a strip. The back electrodes 01Y to 16Y each extend in the Y direction. The back electrodes 01Y to 16Y are arranged so as to be spaced apart at particular intervals in the X direction and approximately parallel to each other. As shown by the hatching in FIG. 4, the intersections (overlapping portions) of the front electrodes 01X to 16X and the back electrodes 01Y to 16Y, with the substrate 50 interposed therebetween, form a detector for detecting a load or the like.

A total of 16 front wires 01x to 16x are arranged on the top surface of the substrate 50. The front wires 01x to 16x are each shaped like a line. The front wires 01x to 16x are formed of a conductive film formed by screen-printing the conductive composition of the present invention. The front wire connector 51 is arranged on the rear-left corner of the substrate 50. The front wires 01x to 16x connect the left ends of the front electrodes 01X to 16X, respectively, to the front wire connector 51. The top surface of the substrate 50, the front electrodes 01X to 16X, and the front wires 01x to 16x are covered with a front cover film (not shown) from above.

A total of 16 back wires 01y to 16y are arranged on the bottom surface of the substrate 50. The back wires 01y to 16y are each shaped like a line. The back wires 01y to 16y are formed of a conductive film formed by screen-printing the conductive composition of the present invention. The back wire connector 52 is arranged on the front-left corner of the substrate 50. The back wires 01y to 16y connect the front ends of the back electrodes 01Y to 16Y, respectively, to the back electrode connector 52. The bottom surface of the substrate 50, the back electrodes 01Y to 16Y, and the back wires 01y to 16y are covered with a back cover film (not shown) from below.

The front wire connector 51 and the back wire connector 52 are each electrically connected with an operation unit (not shown). The operation unit receives impedance at the detector from the front wires 01x to 16x and the back wires 01y to 16y. Based on this, a surface pressure distribution is measured.

The operation effects of the flexible wiring board 5 of the present embodiment will now be described. According to the present embodiment, the front wires 01x to 16x and the back wires 01y to 16y are each flexible and have expandability and contractibility, and thus, can be deformed in accordance with deformation of the substrate 50. The front wires 01x to 16x and the back wires 01y to 16y each have a high conductivity, and the electric resistance is less likely to increase even during expansion. The performance of the flexible wiring board 5 is therefore less likely to be degraded even when the substrate 50 expands and contracts. The flexible wiring board 5 therefore has good durability. As described above, the flexible wiring board 5 is suitable for connecting an expandable/contractible element to an electrical circuit.

EXAMPLES

The present invention will be described more specifically with examples.

<Preparation of Conductive Composition and Production of Conductive Film>

Example 1

First, carbon nanotubes B ("VGCF (registered trademark)" manufactured by SHOWA DENKO K.K., fiber diameter 150 nm, length 10 μm, G/D ratio=5) were wet-milled to produce a flake-like carbon material. The "minimum length (0.15 μm)/the maximum length (10 μm)" of the carbon nanotubes B is not more than 1/5. The milling process was performed using a bead mill (DYNO-MILL) filled with zirconia beads of 0.5 mm in diameter, at a peripheral speed of 10 m/s. Methyl ethyl ketone was used as a solvent. A flake-like carbon material having a maximum length of 240 nm and a thickness of 30 nm (representative value) was thus obtained.

Next, 80 parts by mass of acrylic rubber polymer ("Nipol (registered trademark) AR42" manufactured by ZEON CORPORATION) and 20 parts by mass of a polymer of the following structural formula (a) as a cross-linking agent were dissolved in ethylene glycol monobutyl ether acetate as a solvent to prepare a polymer solution. The mass-average molecular weight of the polymer of the structural formula (a) is about 1500. Subsequently, 25 parts by mass of carbon nanotubes A ("VGCF-X" manufactured by SHOWA DENKO K.K., fiber diameter 15 nm, length 3 μm, G/D ratio=1) as a fibrous carbon material and 20 parts by mass of the produced flake-like carbon material were added to the polymer solution and dispersed with a bead mill (DYNO-MILL) filled with glass beads of 0.5 mm in diameter to prepare a conductive composition (hereinafter called "conductive coating" as appropriate). The peripheral speed of the bead mill was 10 m/s.

[Formula 1]

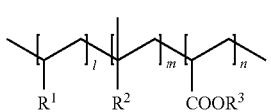

(a)

[where l, m, n are an integer equal to or greater than one]

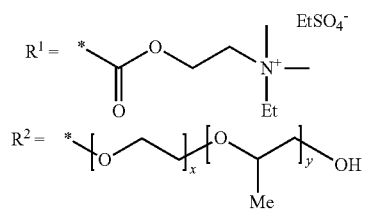

-continued

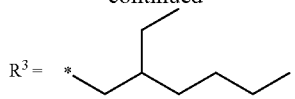

The conductive coating was applied on a surface of a PET substrate by a bar coating process. The coating was thereafter dried by heating at 150° C. for one hour while a cross-linking reaction proceeded. A conductive film of 30 μm in thickness was thus produced.

Figure 2:
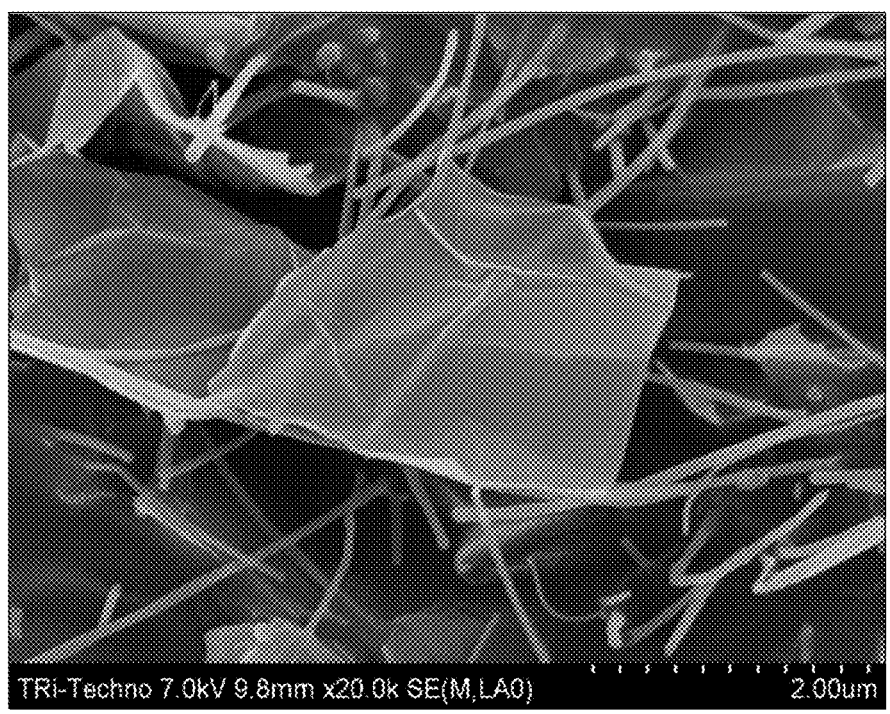
FIG. 2 is an SEM image of a frozen fracture face of a conductive film of Example 1.

The freeze fracture face of the produced conductive film was observed with a scanning electron microscope (SEM). FIG. 2 is an SEM image of the freeze fracture face of the conductive film of Example 1. As shown in FIG. 2, the fibrous carbon nanotubes A are dispersed in the conductive film. The flake-like carbon material having a maximum length of not less than 150 nm and a thickness of not more than 100 nm is dispersed so as to couple a plurality of carbon nanotubes A with each other.

Example 2

A conductive film was produced by preparing a conductive coating in the same manner as in Example 1 except that the blended amount of the flake-like carbon material was changed to 5 parts by mass.

Example 3

A conductive coating was prepared with the kind of flake-like carbon material changed. First, a graphite powder A ("EC1500" manufactured by Ito Kokuen Co., Ltd., G/D ratio=7) was milled in the same manner as in Example 1 to produce a flake-like carbon material. The "minimum length (0.5 μm)/maximum length (10.1 μm)" of the graphite powder A is not more than 1/5. A flake-like carbon material having a maximum length of 160 nm and a thickness of 40 nm (representative value) was thus obtained. Next, 25 parts by mass of the carbon nanotubes A (described above) as the fibrous carbon material and 20 parts by mass of the produced flake-like carbon material were added to the polymer solution prepared in Example 1, and dispersed in the same manner as in Example 1 to prepare a conductive coating. A conductive film was then produced in the same manner as in Example 1.

Example 4

A conductive coating was prepared with the kind of flake-like carbon material changed. First, cup-stacked carbon nanotubes C ("Carber (registered trademark) 24HHT" manufactured by GSI Creos Corporation, fiber diameter (outer diameter) 100 nm, length 5 μm, G/D ratio=5) were milled in the same manner as in Example 1 to produce a flake-like carbon material. The "minimum length (0.1 μm)/maximum length (5 μm)" of the cup-stacked carbon nanotubes C is not more than 1/5. A flake-like carbon material having a maximum length of 200 nm and a thickness of 100 nm (representative value) was thus obtained. Next, 45 parts by mass of the carbon nanotubes A (described above) as the fibrous carbon material and 20 parts by mass of the produced flake-like carbon material were added to the polymer solution prepared in Example 1, and dispersed in the same manner as in Example 1 to prepare a conductive coating. A conductive film was then produced in the same manner as in Example 1.

Example 5

A conductive film was produced by preparing a conductive coating in the same manner as in Example 4 except that the blended amount of the fibrous carbon material was changed to 35 parts by mass and the blended amount of the flake-like carbon material was changed to 10 parts by mass.

Example 6

A conductive film was produced by preparing a conductive coating in the same manner as in Example 4 except that the blended amount of the fibrous carbon material was changed to 15 parts by mass and the blended amount of the flake-like carbon material was changed to 30 parts by mass.

Example 7

A conductive film was produced by preparing a conductive coating in the same manner as in Example 3 except that the blended amount of the fibrous carbon material was changed to 15 parts by mass and the blended amount of the flake-like carbon material was changed to 40 parts by mass.

Example 8

A conductive coating was prepared with the kind of flake-like carbon material changed. First, a graphite powder B ("GR-5" manufactured by Nippon Graphite Industries, ltd., G/D ratio=8) was milled in the same manner as in Example 1 to produce a flake-like carbon material. The "minimum length (0.2 µm)/maximum length (20 µm)" of the graphite powder B is not more than 1/5. A flake-like carbon material having a maximum length of 500 nm and a thickness of 50 nm (representative value) was thus obtained. Next, 25 parts by mass of the carbon nanotubes A (described above) as the fibrous carbon material and 20 parts by mass of the produced flake-like carbon material were added to the polymer solution prepared in Example 1, and dispersed in the same manner as in Example 1 to prepare a conductive coating. A conductive film was then produced in the same manner as in Example 1.

Example 9

A conductive coating was prepared with the kinds of fibrous carbon material and flake-like carbon material changed. Carbon nanotubes D ("NC7000" manufactured by Nanocyl, fiber diameter 9.5 nm, length 1.5 µm) were used as the fibrous carbon material, and the flake-like carbon material produced by milling the cup-stacked carbon nanotubes C in Example 4 was used. Twenty parts by mass of the carbon nanotubes D as the fibrous carbon material and 15 parts by mass of the flake-like carbon material were added to the polymer solution prepared in Example 1, and dispersed in the same manner as in Example 1 to prepare a conductive coating. A conductive film was then produced in the same manner as in Example 1.

Example 10

A conductive film was produced by preparing a conductive coating in the same manner as in Example 9 except that the blended amount of the fibrous carbon material was changed to 10 parts by mass and the blended amount of the flake-like carbon material was changed to 40 parts by mass.

Example 11

A conductive film was produced with the elastomer changed to urethane rubber. First, 100 parts by mass of urethane rubber polymer ("N2304" manufactured by Nippon Polyurethane Industry Co., Ltd.) was dissolved in methyl ethyl ketone as a solvent to prepare a polymer solution. Next, 25 parts by mass of the carbon nanotubes A (described above) as the fibrous carbon material and 20 parts by mass of the flake-like carbon material produced by milling the cup-stacked carbon nanotubes C in Example 4 were added to the polymer solution and dispersed in the same manner as in Example 1 to prepare a conductive coating. A conductive film was produced from the prepared conductive coating in the same manner as in Example 1.

Example 12

A conductive film was produced with the elastomer changed to silicone rubber. First, 100 parts by mass of silicone rubber polymer ("KE1935" manufactured by Shin-Etsu Chemical Co., Ltd.) was dissolved in toluene as a solvent to prepare a polymer solution. Next, 20 parts by mass of the carbon nanotubes A (described above) as the fibrous carbon material and 15 parts by mass of the flake-like carbon material produced by milling the cup-stacked carbon nanotubes C in Example 4 were added to the polymer solution and dispersed in the same manner as in Example 1 to prepare a conductive coating. A conductive film was produced from the prepared conductive coating in the same manner as in Example 1.

Comparative Example 1

A conductive coating was prepared without using a flake-like carbon material. Specifically, 25 parts by mass of the carbon nanotubes A (described above) and 20 parts by mass of the unmilled carbon nanotubes B (described above) were added to the polymer solution prepared in Example 1, and dispersed in the same manner as in Example 1 to prepare a conductive coating. A conductive film was then produced in the same manner as in Example 1.

Comparative Example 2

A conductive coating was prepared without using a flake-like carbon material. Specifically, 25 parts by mass of the carbon nanotubes A (described above) and 20 parts by mass of conductive carbon black ("DENKA BLACK (registered trademark)" manufactured by DENKI KAGAKU KOGYO KABUSHIKI KAISHA, G/D ratio=1) were added to the polymer solution prepared in Example 1, and dispersed in the same manner as in Example 1 to prepare a conductive coating. A conductive film was then produced in the same manner as in Example 1.

Comparative Example 3

A conductive coating was prepared without using a flake-like carbon material. Specifically, 45 parts by mass of the carbon nanotubes A (described above) alone were added to the polymer solution prepared in Example 1, and dispersed in the same manner as in Example 1 to prepare a conductive coating. A conductive film was then produced in the same manner as in Example 1.

Table 1 and Table 2 show the kinds of raw materials used and the blended amounts.

TABLE 1

| | | | Example 1 | Example 2 | Example 3 | Example 4 | Example 5 | Example 6 | Example 7 |
|---|---|---|---|---|---|---|---|---|---|
| Blended amount of raw material (part by mass) | Elastomer | Acrylic rubber | 80 | 80 | 80 | 80 | 80 | 80 | 80 |
| | | Urethane rubber | — | — | — | — | — | — | — |
| | | Silicone rubber | — | — | — | — | — | — | — |
| | Fibrous carbon material | Carbon nanotubes A (φ15 nm, G/D ratio = 1) | 25 | 25 | 25 | 45 | 35 | 15 | 15 |
| | | Carbon nanotubes D (φ9.5 nm) | — | — | — | — | — | — | — |
| | Carbon material before milling | Carbon nanotubes B (φ150 nm, G/D ratio = 5) | — | — | — | — | — | — | — |
| | Flake-like carbon material | Milled product of carbon nanotubes B (maximum length 240 nm, thickness 30 nm) | 20 | 5 | — | — | — | — | — |
| | | Milled product of cup-stacked carbon nanotubes C (G/D ratio = 5) (maximum length 200 nm, thickness 100 nm) | — | — | — | 20 | 10 | 30 | — |
| | | Milled product of graphite powder A (G/D ratio = 7) (maximum length 160 nm, thickness 40 nm) | — | — | 20 | — | — | — | 40 |
| | | Milled product of graphite powder B (G/D ratio = 8) (maximum length 500 nm, thickness 50 nm) | — | — | — | — | — | — | — |
| | Conductive carbon black | G/D ratio = 1 | — | — | — | — | — | — | — |
| | Cross-linking agent | Polymer of structural formula (a) | 20 | 20 | 20 | 20 | 20 | 20 | 20 |
| Fibrous carbon material content in conductive composition (solid content) [% by mass] | | | 17.2 | 19.2 | 17.2 | 27.3 | 24.1 | 10.3 | 9.7 |
| Flake-like carbon material content in conductive composition (solid content) [% by mass] | | | 13.8 | 3.8 | 13.8 | 12.1 | 6.9 | 20.7 | 25.8 |
| Evaluation results | Volume resistivity in natural state [Ω·cm] | | 0.07 | 0.09 | 0.05 | 0.07 | 0.10 | 0.10 | 0.07 |
| | Volume resistivity during 5% expansion [Ω·cm] | | 0.07 | 0.09 | 0.05 | 0.08 | 0.09 | 0.12 | 0.09 |
| | Volume resistivity during 50% expansion [Ω·cm] | | 0.08 | 0.09 | 0.08 | 0.12 | 0.10 | 0.22 | 0.22 |
| | Volume resistivity during 100% expansion [Ω·cm] | | 0.07 | 0.10 | 0.09 | 0.07 | 0.20 | 0.25 | 0.29 |

TABLE 2

| | | | Example 8 | Example 9 | Example 10 | Example 11 | Example 12 | Comparative Example 1 | Comparative Example 2 | Comparative Example 3 |
|---|---|---|---|---|---|---|---|---|---|---|
| Blended amount of raw material (part by mass) | Elastomer | Acrylic rubber | 80 | 80 | 80 | — | — | 80 | 80 | 80 |
| | | Urethane rubber | — | — | — | 100 | — | — | — | — |
| | | Silicone rubber | — | — | — | — | 100 | — | — | — |
| | Fibrous carbon material | Carbon nanotubes A (φ15 nm, G/D ratio = 1) | 25 | — | — | 25 | 20 | 25 | 25 | 45 |
| | | Carbon nanotubes D (φ9.5 nm) | — | 20 | 10 | — | — | — | — | — |
| | Carbon material before milling | Carbon nanotubes B (φ150 nm, G/D ratio = 5) | — | — | — | — | — | — | 20 | — |
| | Flake-like carbon material | Milled product of carbon nanotubes B (maximum length 240 nm, thickness 30 nm) | — | — | — | — | — | — | — | — |
| | | Milled product of cup-stacked carbon nanotubes C (G/D ratio = 5) (maximum length 200 nm, thickness 100 nm) | — | 15 | 40 | 20 | 15 | — | — | — |
| | | Milled product of graphite powder A (G/D ratio = 7) (maximum length 160 nm, thickness 40 nm) | — | — | — | — | — | — | — | — |

TABLE 2-continued

|  |  |  | Example 8 | Example 9 | Example 10 | Example 11 | Example 12 | Comparative Example 1 | Comparative Example 2 | Comparative Example 3 |
|---|---|---|---|---|---|---|---|---|---|---|
|  |  | Milled product of graphite powder B (G/D ratio = 8) (maximum length 500 nm, thickness 50 nm) | 20 | — | — | — | — | — | — | — |
|  | Conductive carbon black | G/D ratio = 1 | — | — | — | — | — | — | 20 | — |
|  | Cross-linking agent | Polymer of structural formula (a) | 20 | 20 | 20 | — | — | 20 | 20 | 20 |
| Fibrous carbon material content in conductive composition (solid content) [% by mass] |  |  | 17.2 | 14.8 | 6.7 | 17.2 | 14.8 | — | — | — |
| Flake-like carbon material content in conductive composition (solid content) [% by mass] |  |  | 13.8 | 11.1 | 26.7 | 13.8 | 11.1 | — | — | — |
| Evaluation results | Volume resistivity in natural state [Ω·cm] |  | 0.06 | 0.09 | 0.10 | 0.08 | 0.10 | 0.10 | 0.32 | 0.37 |
|  | Volume resistivity during 5% expansion [Ω·cm] |  | 0.07 | 0.09 | 0.13 | 0.08 | 0.12 | 0.21 | 0.49 | 0.84 |
|  | Volume resistivity during 50% expansion [Ω·cm] |  | 0.14 | 0.12 | 0.24 | 0.09 | 0.13 | 0.34 | 0.63 | 1.59 |
|  | Volume resistivity during 100% expansion [Ω·cm] |  | 0.16 | 0.15 | 0.29 | 0.11 | 0.16 | over measurement limit | 0.73 | 2.74 |

<Evaluations of Conductive Compositions and Conductive Films>

The conductivity of the produced conductive films was evaluated as follows. First, the volume resistivity of the conductive film in a natural state (before expansion) was measured. The measurement of the volume resistivity was conducted in accordance with the parallel terminal electrode method of JIS K6271 (2008). In measurement of the volume resistivity, a commercially available rubber sheet ("VHB (registered trademark) 4910" manufactured by Sumitomo 3M Limited) was used as an insulating resin support for supporting the conductive film (test piece). The conductive film was then expanded in a uniaxial direction at an expansion ratio of 5%, and the volume resistivity was measured. The volume resistivity was measured with the expansion ratio changed to 50% and 100%. The expansion ratio was calculated by the following equation (1).

$$\text{Expansion ratio}(\%) = (\Delta L_0/L_0) \times 100 \tag{1}$$

[$L_0$: distance between reference lines of the test piece, $\Delta L_0$: an increase due to expansion of the distance between reference lines of the test piece]

The measurement results of the volume resistivity are shown in Table 1 and Table 2. As shown in Table 1 and Table 2, all the conductive films of Examples 1 to 12 had a high conductivity, and a change in volume resistivity was small even when expanded. In contrast, in the conductive film of Comparative Example 1 containing the carbon nanotubes B having a large diameter before milling in place of the flake-like carbon material, the volume resistivity in a natural state was small but the increase in volume resistivity during expansion was extremely large. In the conductive film of Comparative Example 2 containing conductive carbon black in place of the flake-like carbon material, the volume resistivity in a natural state was large, and the volume resistivity increased in accordance with expansion. Similarly, in the conductive film of Comparative Example 3 containing no flake-like carbon material but containing the fibrous carbon material only, the volume resistivity in a natural state was large, and the volume resistivity increased in accordance with expansion.

INDUSTRIAL APPLICABILITY

The conductive composition and the conductive film of the present invention are suitable for electrodes and wires of flexible actuators, sensors, etc., as well as electromagnetic shields, flexible wiring boards, etc. for use in wearable devices and the like. The use of the conductive film of the present invention in electrodes and wires can improve the durability of electronic equipment mounted on flexible parts such as movable units of robots, nursing care equipment, and interiors of transportation equipment.

The invention claimed is:
1. A conductive composition comprising:
an elastomer component;
a fibrous carbon material having a fiber diameter of less than 30 nm; and
a flake-like carbon material having a graphite structure, having an intensity ratio (G/D ratio) of a peak (G band) appearing in the vicinity of 1580 cm$^{-1}$ to a peak (D band) appearing in the vicinity of 1330 cm$^{-1}$ of Raman spectrum of not less than 1.8, and having a maximum length of not less than 150 nm and a thickness of not more than 100 nm, wherein,
the flake-like carbon material is produced from a carbon material having a graphite structure, a G/D ratio of Raman spectrum of not less than 1.8, and a ratio of the minimum length to the maximum length (minimum length/maximum length) of not more than ⅕,
the content of the fibrous carbon material is not less than 5% by mass and not more than 30% by mass with respect to 100% by mass of the solid content of the conductive composition,
the content of the flake-like carbon material is not less than 3% by mass and not more than 30% by mass with respect to 100% by mass of the solid content of the conductive composition, and
a blend ratio of the fibrous carbon material to the flake-like carbon material is set in a range of 5:1 to 1:4 by mass.
2. The conductive composition according to claim 1, wherein the carbon material is one or more kinds selected from carbon nanotubes having a fiber diameter of 30 nm or more, cup-stacked carbon nanotubes, graphite, and expanded graphite.

3. The conductive composition according to claim 1, wherein the fibrous carbon material is carbon nanotubes.

4. A conductive film formed from the conductive composition according to claim 1.

5. The conductive film according to claim 4 formed by screen printing or metal mask printing.

6. The conductive film according to claim 4 formed on a surface of a substrate that is expandable and contractible, or bendable.

7. The conductive film according to claim 6, wherein
the elastomer component in the conductive composition has a cross-linkable functional group;
the substrate is made of a polymer having a functional group; and
the conductive film is bonded to the substrate through chemical bonding between the cross-linkable functional group and the functional group.

8. An electromagnetic shield formed of the conductive film according to claim 4.

9. A transducer comprising:
a dielectric layer made of a polymer;
a plurality of electrodes arranged with the dielectric layer interposed therebetween; and
a wire connected to each of the electrodes, wherein
either or both of the electrodes and the wire are formed of the conductive film according to claim 4.

10. A flexible wiring board comprising:
a substrate; and
a wire arranged on a surface of the substrate, wherein
at least part of the wire is formed of the conductive film according to claim 4.

* * * * *